(12) United States Patent  
Brahmasandra et al.

(10) Patent No.: US 10,239,060 B2  
(45) Date of Patent: *Mar. 26, 2019

(54) THERMOCYCLING SYSTEM, COMPOSITION, AND MICROFABRICATION METHOD

(71) Applicant: NeuMoDx Molecular, Inc., Ann Arbor, MI (US)

(72) Inventors: Sundaresh Brahmasandra, Ann Arbor, MI (US); Thomas Haddock, Ann Arbor, MI (US); Patrick Duffy, Whitmore Lake, MI (US); Jeffrey Williams, Chelsea, MI (US)

(73) Assignee: NeuMoDx Molecular, Inc., Ann Arbor, MI (US)

( * ) Notice: Subject to any disclaimer, the term of this patent is extended or adjusted under 35 U.S.C. 154(b) by 101 days.

This patent is subject to a terminal disclaimer.

(21) Appl. No.: 15/297,736

(22) Filed: Oct. 19, 2016

(65) Prior Publication Data

US 2017/0036209 A1 Feb. 9, 2017

Related U.S. Application Data

(63) Continuation of application No. 14/487,808, filed on Sep. 16, 2014, now Pat. No. 9,499,896.

(Continued)

(51) Int. Cl.
*B01L 3/00* (2006.01)
*B01L 1/00* (2006.01)
(Continued)

(52) U.S. Cl.
CPC ............. *B01L 7/52* (2013.01); *C23C 14/025* (2013.01); *C23C 14/165* (2013.01); *C23C 14/24* (2013.01); *C23C 14/34* (2013.01); *B01L 2200/12* (2013.01); *B01L 2200/147* (2013.01); *B01L 2300/0819* (2013.01); *B01L 2300/0887* (2013.01);

(Continued)

(58) Field of Classification Search
CPC ............ B01L 7/525; B01L 2300/1822; B01L 2300/1827; B01L 3/502723; B01L 7/52
See application file for complete search history.

(56) References Cited

U.S. PATENT DOCUMENTS

| 5,563,067 A | 10/1996 | Sugihara et al. |
| 2002/0028507 A1 | 3/2002 | Heimberg et al. |

(Continued)

*Primary Examiner* — Nathan A Bowers
(74) *Attorney, Agent, or Firm* — Jeffrey Schox

(57) ABSTRACT

A system and method of manufacture for the system, comprising a set of heater-sensor dies, each heater-sensor die comprising an assembly including a first insulating layer, a heating region comprising an adhesion material layer coupled to the first insulating layer and a noble material layer, and a second insulating layer coupled to the heating region and to the first insulating layer through a pattern of voids in the heating region, wherein the pattern of voids in heating region defines a coarse pattern associated with a heating element of the heating region and a fine pattern, integrated into the coarse pattern and associated with a sensing element of the heating region; an electronics substrate configured to couple heating elements and sensing elements of the set of heater-sensor dies to a controller; and a set of elastic elements configured to bias each of the set of heater-sensor dies against a detection chamber.

20 Claims, 9 Drawing Sheets

Related U.S. Application Data

(60) Provisional application No. 61/879,513, filed on Sep. 18, 2013.

(51) Int. Cl.
  *B01L 7/00*   (2006.01)
  *C23C 14/02*  (2006.01)
  *C23C 14/16*  (2006.01)
  *C23C 14/24*  (2006.01)
  *C23C 14/34*  (2006.01)

(52) U.S. Cl.
  CPC ... *B01L 2300/123* (2013.01); *B01L 2300/168* (2013.01); *B01L 2300/1827* (2013.01); *B01L 2300/1883* (2013.01)

(56)  References Cited

U.S. PATENT DOCUMENTS

| | | |
|---|---|---|
| 2004/0086424 A1 | 5/2004 | Schembri |
| 2004/0151629 A1 | 8/2004 | Pease et al. |
| 2008/0269066 A1 | 10/2008 | Flechsig et al. |
| 2010/0086991 A1 | 4/2010 | Fish |
| 2011/0268151 A1 | 11/2011 | Hadwen et al. |
| 2011/0272575 A1* | 11/2011 | Kim .................... B41J 2/04563 250/288 |
| 2012/0230887 A1 | 9/2012 | Zucchelli |
| 2013/0102064 A1 | 4/2013 | Fontana et al. |

\* cited by examiner

THERMOCYCLING SYSTEM, COMPOSITION, AND MICROFABRICATION METHOD

CROSS-REFERENCE TO RELATED APPLICATIONS

This application is a continuation of U.S. patent application Ser. No. 14/487,808, filed 16 Sep. 2014 which claims the benefit of U.S. Provisional Application Ser. No. 61/879,513 filed 18 Sep. 2013, which is incorporated in its entirety herein by this reference.

TECHNICAL FIELD

This invention relates generally to the molecular diagnostics field, and more specifically to an improved sample thermocycling system and fabrication process thereof.

BACKGROUND

Molecular diagnostics is a clinical laboratory discipline that has developed rapidly during the last 25 years. It originated from basic biochemistry and molecular biology research procedures, but now has become an independent discipline focused on routine analysis of nucleic acids (NA), including deoxyribonucleic acid (DNA) and ribonucleic acid (RNA) for diagnostic use in healthcare and other fields involving analysis of nucleic acids. Molecular diagnostic analysis of biological samples can include the detection of one or more nucleic acid materials present in the specimen. The particular analysis performed may be qualitative and/or quantitative. Methods of analysis typically involve isolation, purification, and amplification of nucleic acid materials, and polymerase chain reaction (PCR) is a common technique used to amplify nucleic acids. Often, a nucleic acid sample to be analyzed is obtained in insufficient quantity, quality, and/or purity, hindering a robust implementation of a diagnostic technique. Current sample processing methods and molecular diagnostic techniques are often labor/time intensive, low throughput, and expensive, and systems of analysis are insufficient.

A rapid and efficient thermocycling system that can reliably thermocycle reagents used for processing of nucleic acids can significantly improve the efficiency and effective implementation of molecular diagnostic techniques, such as realtime polymerase chain reaction (RT-PCR). Microfabrication techniques can produce such thermocycling systems comprising precision heaters with low thermal masses and with well-coupled temperature sensors. However, challenges are inherent in ensuring that the microfabrication and assembly processes utilized to fabricate thermal cycling elements are extremely robust and reliable.

Due to these challenges and deficiencies of current molecular diagnostic systems and methods, there is thus a need for an improved sample thermocycling system and fabrication process thereof. This invention provides such a system and fabrication process.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. System

Figure 1A:
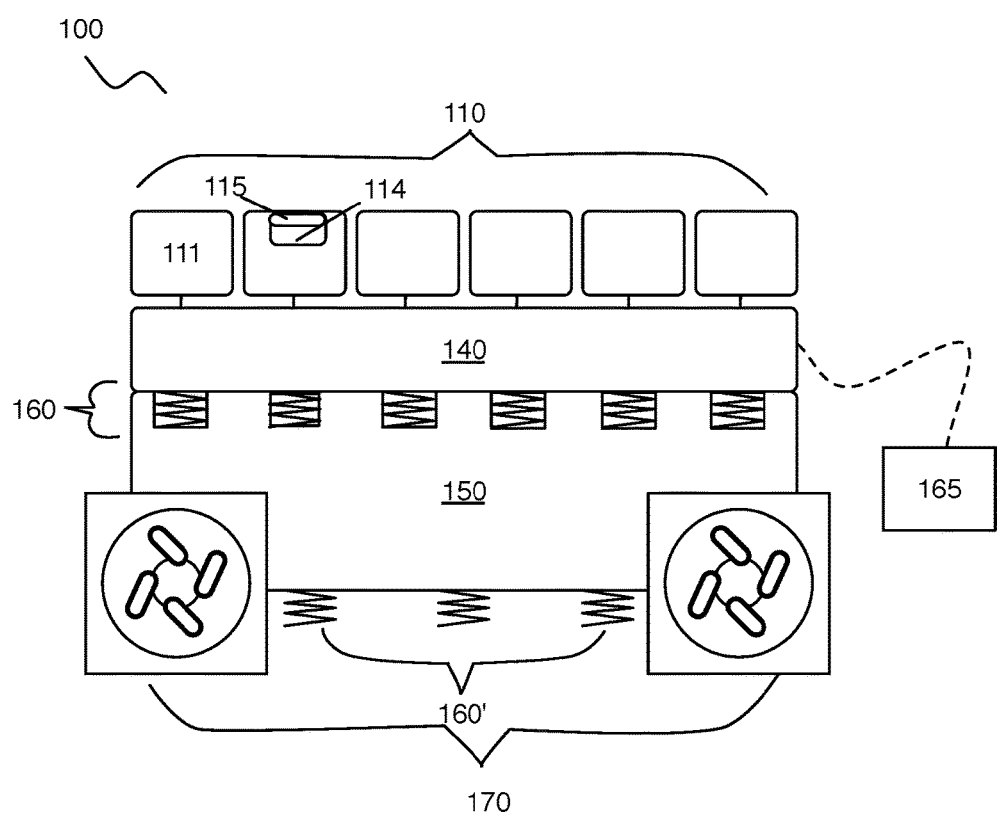
FIGS. 1A and 1B depict embodiments of a thermocycling system.
Figure 1B:
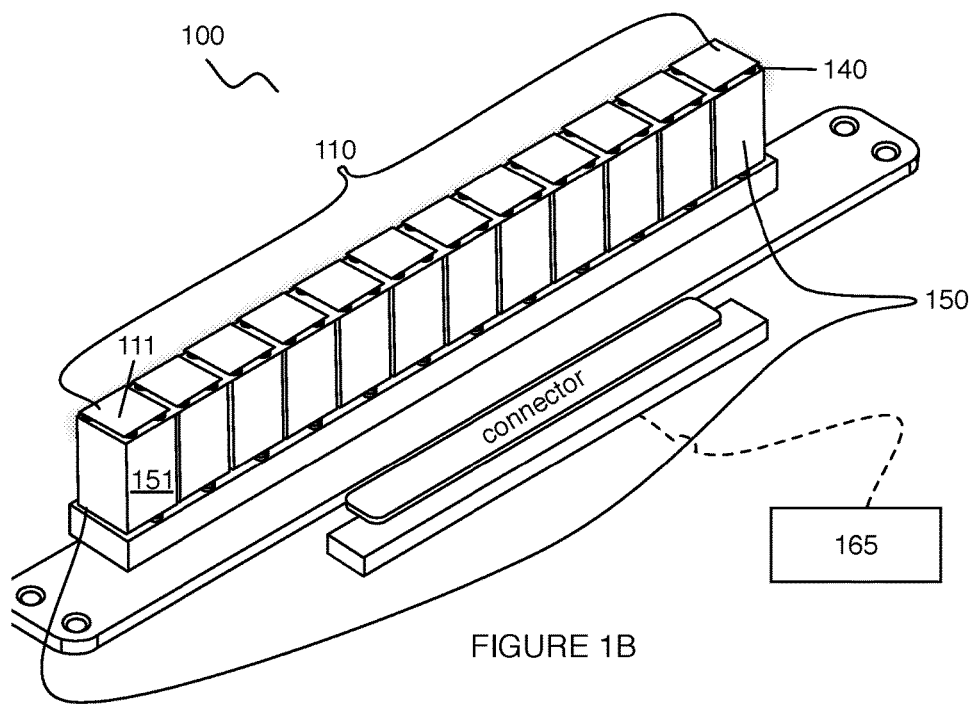

As shown in FIGS. 1A and 1B, an embodiment of a system 100 for thermocycling biological samples within detection chambers comprises: a set of heater-sensor dies 110; an electronics substrate 140 that couple the set of heater-sensor dies to a controller; a set of heat sink supports 150 coupled to at least one of the electronics substrate and the set of heater-sensor dies; and a set of elastic elements 160 coupled to the electronics substrate and configured to bias each of the set of heater-sensor dies against a detection chamber. In some embodiments, the system 100 further comprises a controller 165 and/or a cooling subsystem 170 configured to actively cool the system 100.

The system 100 functions to enable rapid thermal cycling of samples while providing uniform heating and preventing signal drift. In specific applications, the system 100 can be used to rapidly and controllably thermocycle nucleic acid samples during performance of molecular diagnostic amplification techniques (e.g., PCR, RT-PCR), signal amplification techniques (e.g., bDNA, hybrid capture), and analytical techniques (e.g., gel electrophoresis, mass spectrometry). The system 100 can also provide rapid thermocycling without significant power requirements, ensure a closer correlation between the actual heating temperature and the temperature set-point by implementing an integrated heater-sensor die, and controllably and individually heat small sample volumes (e.g., picoliters, nanoliters) based upon a microfabrication technique that also enables mass production of the system 100. Furthermore, the system 100 implements a priori predictions of electrical resistance values of thin film combinations of the set of heater-sensor dies 110, and accounts for and/or prevents signal drift to maintain controlled sample heating. In some variations, the system 100 can be integrated into a molecular diagnostic system, such as that described in U.S. Pub. No. 2013/0210015, entitled "System and Method for Processing and Detecting Nucleic Acids", and filed on 13 Feb. 2013; however, the system 100 can additionally or alternatively be used with any other suitable system for processing biological or non-biological samples.

1.1 Heater-Sensor Dies

The set of heater-sensor dies 110 functions to controllably heat individual sample volumes. Preferably, each heater-sensor die 111 is a thin-film die that can be deposited onto another substrate (e.g., silicon, glass substrate) that can be packaged onto an electronics substrate 140 (e.g., printed circuit board, PCB); however, each heater-sensor die 111 can alternatively comprise any suitable geometry and/or configuration that enables controlled, uniform, and rapid heating of a detection chamber in thermal communication with the heater-sensor die 111. In some embodiments, the detection chambers can be those described in U.S. Pub. No. 2013/0209326, entitled "Microfluidic Cartridge for Processing and Detecting Nucleic Acids" and filed on 13 Feb. 2013, which is herein incorporated in its entirety by this reference; however, the detection chambers can alternatively be any other suitable container for processing a biological sample. Preferably, each heater-sensor die 111 is characterized by a small profile (e.g., <10 mm dimension), which ensures that the heater-sensor die 111 is able to thermocycle rapidly; however, a heater-sensor die 111 can alternatively be characterized by any suitable profile in order to meet any other thermocycling requirement. Additionally, each heater-sensor die 111 in the set of heater-sensor dies 110 is preferably configured to conform to a detection chamber (e.g., sample tube, sample container, sample heating zone of a cartridge for processing samples) configured to contain a sample during heating; however, a heater-sensor die 111 in the set of heater-sensor dies 110 can alternatively not conform to a detection chamber for processing of a biological sample.

Figure 2:
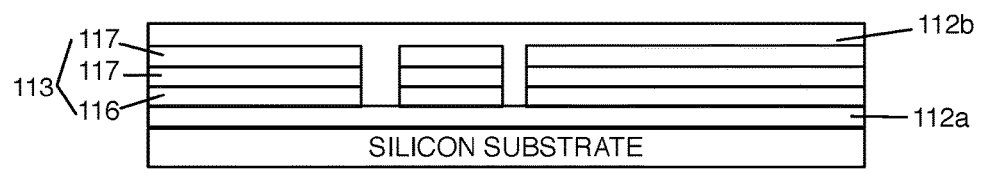
FIG. 2 depicts an example schematic of a heater-sensor die during fabrication in an example of a thermocycling system.

Preferably, each heater-sensor die 111 in the set of heater sensor dies 110 comprises an assembly including: a first insulating layer 112a that functions to provide an insulating barrier to isolate the heaters and sensors and a heating region 113 that functions to provide uniform sample heating. Some variations can further include a second insulating layer 112b that functions to provide an additional insulating barrier that opposes the first insulating layer 112a. The insulating layer(s) 112a, 112b are preferably electrically insulating, but can additionally be thermally insulating in variations where localized heating is also desired. Furthermore, each heater-sensor die 111 preferably comprises two insulating layers 112a, 112b that are configured to "sandwich" the heating region 113, thus isolating the heating region 113 at least at two surfaces of the heating region 113; however, each heater-sensor die 111 can alternatively comprise any suitable number of insulating layers 112 arranged relative to the heating region 113 in any suitable manner. In one variation, as described in further detail below, the heating region 113 can include a pattern of voids that defines elements of the heating region, and a second insulating layer 112b can be configured to couple to the heating region 113 and to the first insulating layer 112a through the pattern of voids in the heating region 113, as shown in FIG. 2. The second insulating layer 112b can, however, be configured to couple to the heating region 113 and/or to the first insulating layer 112a in any other suitable manner.

Figure 3:
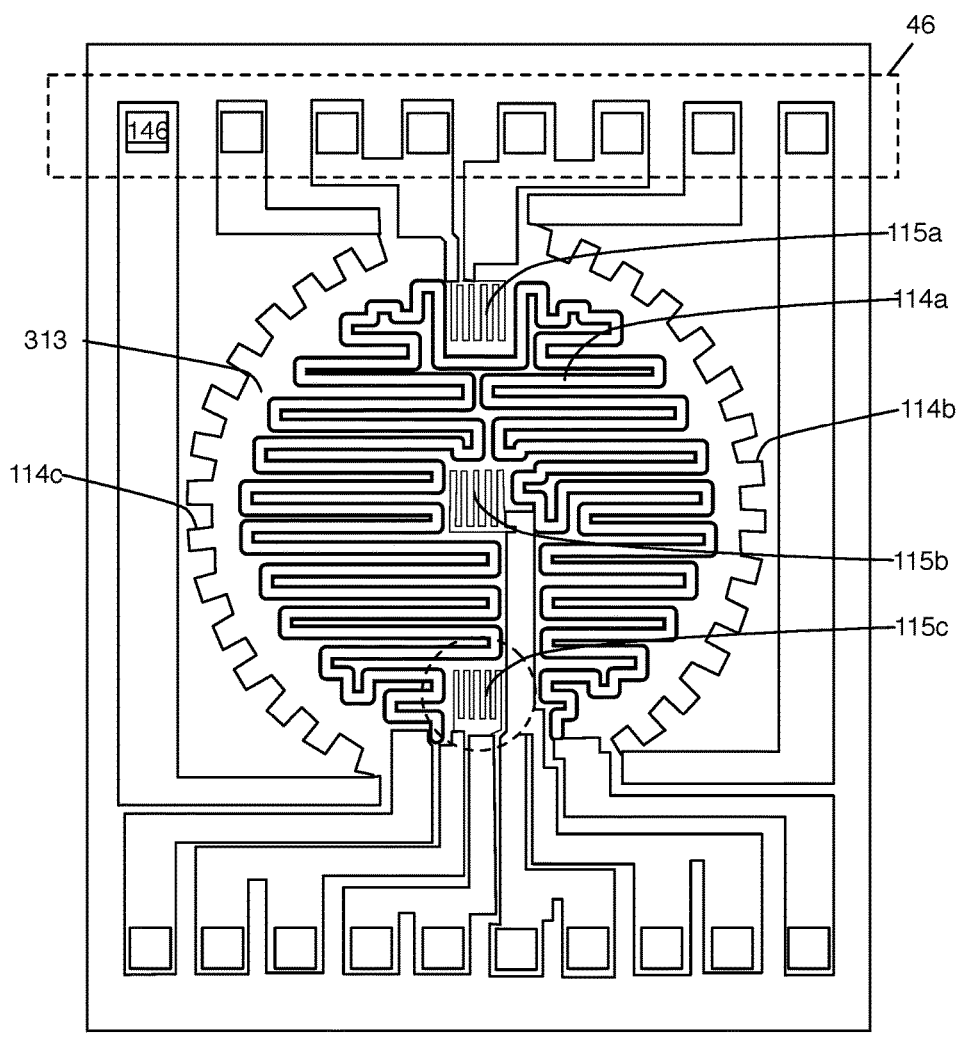
FIG. 3 depicts an example of heating and sensing elements in an example of a thermocycling system.

The heating region 113 preferably comprises a heating element 114 with an integrated sensing element 115, as shown in FIG. 3, and is composed of at least one metal or metal alloy, with configurations described in further detail below. Furthermore, the heating region 113 preferably defines a pattern 313 of voids having geometric features (e.g., width, thickness, length, spacing) that facilitate uniform heating and provide desired heating and sensing characteristics (e.g., resistance characteristics). In some variations, the pattern 313 can comprise any one or more of: linear segments, non-linear segments, boustrophedonic segments, continuous segments, non-continuous segments, and any other suitable segment(s) having any other suitable geometry (i.e., width, depth, height, length, path, etc.). The pattern 313 can be symmetric about any suitable reference (e.g., reference line, reference plane, etc.), or can alternatively be non-symmetric. Furthermore, in some variations, the pattern 313 can define a global morphology (e.g., circular footprint, ellipsoidal footprint, polygonal footprint, etc.) at a first scale (e.g., macroscopic scale) but have a local morphology at a second scale (e.g., microscopic scale), wherein the local morphology provides desired characteristics (e.g., resistance characteristics) that are attributed to elements (e.g., heating elements 114, sensing elements 115) of the heating region 113. As such, the global morphology can provide conformation (e.g., in shape) between the heating region 113 and a detection chamber coupled to or corresponding to a heater-sensor die 111, and the local morphology can provide uniform heating and/or accurate sensing of heating parameters by utilizing structural features having a smaller governing dimension.

In a specific example, as shown in FIG. 3, the heating elements 114a, 114b, 114c with integrated sensing elements 115a, 115b, 115c are defined by a pattern 313 with a global morphology characterized by a circular footprint, but a local morphology of structures characterized by a continuous boustrophedonic arrangement, wherein both the global morphology and local morphology were designed according to theory and fabricated as described in further detail below. In the specific example, the sensing element 115 is configured to be centrally located within the global morphology of the heating element 114. However, in alternative variations, the heating region 113 can alternatively not comprise an integrated sensing element 115, can comprise any suitable number of heating elements 114/sensing elements 115, and/or can be composed of any other suitable material.

Furthermore, during processing, each heater-sensor die 111 in the set of heater-sensor dies 110 is preferably annealed, as described in further detail below, to improve adhesion and settling of the heater-sensor materials (e.g., on a silicon substrate). The annealing can comprise a single stage of annealing or multiple stages of annealing, and can additionally or alternatively comprise different conditions (e.g., temperatures, durations, environmental conditions) during the annealing stage(s). To exemplify an effect that changes in resistance behavior can have upon heating and sensing function, a ~1-2Ω deviation in resistance can cause significant deviations (e.g., 5-10° C.) between intended and actual temperatures attained by a heater-sensor die 111. Such deviations in temperature can lead to unwanted variability in molecular diagnostic technique results and/or unreliable data (e.g., false positives, false negatives, indeterminate results). Even further, temperature swings greater than 10° C. can result in permanent damage to the thermocycling system 100 and/or to a sample being processed using the system 100. Given the importance of maintaining the calibration of the sensing elements 115 over long periods of time, it is preferable to ensure that minimal dynamics occur in the materials of the heater-sensor dies 111 after fabrication is complete. Since a majority of changes in resistance (e.g., drift) come from thermal reactions, settling, diffusion, and improved adhesion, annealing can accelerate the processes that lead to changes in resistance, thus producing heater-sensor dies 111 with stable resistance behavior (e.g., stable for 3-5 years) by driving dynamic processes toward an equilibrium state (or other stable state) prior to use of the heater-sensor dies 111 in sample-processing applications. Preferably, annealing thus produces stable resistances that are substantially low (in order to enable driving at low voltages) and have limited variability, indicating that underlying material dynamics have reached equilibrium. Alternatively, during processing, each heater-sensor die 111 in the set of heater-sensor dies 110 may not be annealed, can comprise elements that limit temperature swings, and/or may undergo any other suitable process to produce stable resistance behavior in any other suitable manner.

In one variation, as shown in FIG. 2, the insulating layers 112a, 112b of the heater-sensor die 111 are composed of an oxide (e.g., silicon oxide), and the heating region 113 comprises an adhesion material layer 116 coupled to the first insulating layer 112a and configured to promote adhesion of additional deposited layers (e.g., a noble material layer 117) of the heating region 113, and at least one noble material layer 117 coupled to the adhesion material layer 116 and configured to reduce or prevent signal drift that can result due to diffusion of the adhesion layer 116. In this variation, the first insulating layer 112a is grown or deposited uniformly on the surface of a silicon wafer (e.g., by thermal oxidation), the material layers 116, 117 of the heating region 113 are deposited upon the first insulating layer 112a (e.g., by evaporation, by sputtering, etc.), the heating region 113 is etched to define the heater/sensor pattern 313 of the heating element 114 and the sensing element 115 (e.g., by lithography using a positive resist, by lithography using a negative resist), and a second insulating layer 112b is deposited on the heating region 113 (e.g., by chemical vapor deposition) to insulate the heating region 113 between two insulating oxide layers. Preferably, the adhesion materials used in the adhesion material layer(s) 116 comprise materials that are oxygen-active to react (e.g., chemically react) with an oxide surface (e.g., of an insulating layer 112a, 112b). In examples, the adhesion material layer 116 can be composed of any one or more of: chromium, titanium, niobium, vanadium and any combination or alloy thereof. In examples, the noble material layer can be composed of any one or more of: gold, platinum, tungsten, palladium, and any combination or alloy thereof. Furthermore, variations of the examples can include any suitable number of adhesion material layer(s) 116 and/or noble material layer(s) 117 coupled between the insulating layer(s) 112a, 112b, wherein each layer 116, 117 can have any other suitable thickness.

In a first specific example of this variation, as shown in FIG. 3, a heater-sensor die 111 is configured to uniformly heat a circular region having a diameter of 5 mm, the heater-sensor die 111 has a footprint spanning a region of ~8.6 mm×7 mm, and the heating region 113 of the heater-sensor die 111 defines three heating elements 114a, 114b, 114c: a central circular heating element 114a and two circumferential heating elements 114b, 114c configured to form a boundary with a serpentine-shaped pattern about the central circular heating element 114a. In the first specific example, the two circumferential heating elements 114b, 114c each form a semicircular perimeter about the central circular heating element 114a. The heater-sensor die 111 in the first specific example further comprises three integrated sensing elements (i.e., resistance temperature sensors, RTDs) distributed at three locations within the 5 mm circular region. In the first specific example, the heating elements 114 comprise a 50 nm chromium adhesion material layer 116 and a 200 nm gold noble material layer 117 and were etched away in a boustrophedonic pattern to define the pattern of voids 313, designed using a layout editor (e.g., Mentor Graphics™ or L-Edit™), to form the heating elements 114 and the sensing elements 115. The heating elements 114a, 114b, 114c are defined by coarse patterning in the first specific example, and the sensing elements 115 are integrated with the heating elements 114a, 114b, and 114c and defined by fine patterning, as shown in FIGS. 3A and 3B. In the first specific example, the heating elements 114 are characterized with resistances in the range of 40-100Ω and the accompanying sensing elements 115 (i.e., RTDs) are characterized with resistances in the range of 200-250Ω prior to annealing. With annealing at 400 F in an inert $N_2$ atmosphere, the resistances for both the heating elements 114 and the sensing elements 115 increased 400-600% after 1 hour, and increased up to 800% with increasing anneal times.

In other embodiments of the heater-sensor dies 111, the heating element(s) 114 and/or the sensing element(s) 115 can comprise other combinations of adhesion material layer(s) 116 and/or noble material layer(s) 117 in addition to or alternative to chromium and gold, including any one or more of: titanium (adhesion), platinum (noble), tungsten (noble), and any combination or alloy thereof. In particular, chromium and titanium can serve as preferable adhesion materials for an active noble layer being coupled to the adhesion material layer 116, due to attributes that enable them to react with oxide materials. The combination of chromium and gold additionally can undergo processing by a lift-off method or an etching process to form a heating element 114 and/or a sensing element 115, as described in further detail in Section 2 below. While in some applications it can be difficult to etch platinum films due to platinum's non-reactivity, platinum has a preferable temperature coefficient of resistance (TCR) of ~0.00385 Ω/Ω/C that makes it stable and preferable for RTD fabrication. Platinum and/or titanium can even serve as an intermediate buffer layer 119, configured between an adhesion material layer 116 and a noble material layer 117, that can prevent diffusion from an adhesion material layer 116 into a noble material layer 117 and stabilize resistance behavior (e.g., electrical resistance dynamics). As such, variations of the heating region 113 can include any suitable number of intermediate buffer layers 119 that prevent diffusion between an adhesion material layer 116 into an adjacent noble material layer 117.

In a second specific example, the heating elements 114 comprise a 50 nm chromium adhesion material layer 116, an 100 nm platinum intermediate buffer layer 119 coupled to the adhesion material layer 116, and a 300 nm gold noble material layer 117 coupled to the intermediate buffer layer 119 and were etched away in an identical pattern to that in the first specific example to form a surface including the heating and sensing elements 114, 115. Similar to the first specific example, the heating elements 114 of the second specific example are defined by coarse patterning, and the sensing elements 115 are defined by fine patterning and integrated into the coarse patterning of the heating elements 114. Also similar to the first specific example, the heating region 113 is configured between two insulating layers 112a, 112b in the second specific example. In the second specific example, the heating elements 114 were characterized to have resistances of approximately 50Ω and the sensing elements were characterized to have resistances around 130Ω prior to annealing. After annealing at 400 F in an inert $N_2$ atmosphere, the resistances for both the heating elements 114 and the sensing elements increased 10-30% after 1 hour, with no substantial further change in resistance following additional annealing of 2 hours.

In a third specific example, the heating elements 114 comprise a 50 nm chromium adhesion material layer 116 and a 100 nm platinum noble material layer 117 coupled to the adhesion material layer 116 and were etched away in an identical pattern to that in the first specific example, to form a surface including the heating and sensing elements 114, 115. Similar to the first specific example, the heating elements 114 of the third specific example are defined by coarse patterning, and the sensing elements 115 are integrated with the coarse patterning of the heating elements 114 and defined by fine patterning. Also similar to the first specific example, the heating region 113 is configured between two insulating layers 112a, 112b in the third specific example. In the third specific example, the heating elements 114 are characterized with resistances around 2Ω prior to annealing. After annealing at 400 F in an inert $N_2$ atmosphere, the resistances for the heating elements 114 decreased 7% after 1 hour, with no substantial change in resistance following additional annealing of 2 hours.

In a fourth specific example, the heating elements 114 comprise a 50 nm titanium/tungsten adhesion material layer 116 and a 440 nm gold noble material layer 117 and were etched away in an identical pattern to that in the first specific example, to form a surface including the heating and sensing elements 114, 115. Similar to the first specific example, the heating elements 114 are defined by coarse patterning, and the sensing elements 115 are integrated with the coarse patterning of the heating elements 114 and defined by fine patterning. Also similar to the first specific example, the heating region 113 is configured between two insulating layers 112a, 112b in the fourth specific example. In the fourth specific example, the heating elements 114 are characterized with resistances around 40Ω and the sensing elements 115 are characterized with resistances around 100Ω prior to annealing. After annealing at 400 F in an inert $N_2$ atmosphere, the resistances for both the heating elements 114 and the sensing elements 115 decreased 11-14% after 1 hour, with no substantial further change in resistance following additional annealing of 2 hours.

In the second, third, and fourth specific examples, analysis of the resistance values pre-annealing and post-annealing indicated that the compositions and processing of the respective thin film layers 112, 116, 117 significantly stabilize the resistance values and dynamics of resistance behavior of the heating and sensing elements 114, 115 after annealing. The third specific example with chromium and platinum layers demonstrated substantially no variance from pre-anneal measurements of the electrical resistance after the second annealing step, and the fourth specific example with titanium, tungsten, and gold layers demonstrated a 11%-14% reduction in resistance following the first annealing step but then showed no additional variance after the second annealing step. No further changes in resistance following stages of annealing indicate that the dynamic behavior of the materials has been arrested or completed (e.g., has reached equilibrium). The second specific example with chromium, platinum, and gold layers demonstrated a slightly higher variance (~10%-30%) from pre-anneal resistance values indicating a higher level of dynamic behavior in these thin films, and further annealing was not completely sufficient to arrest the dynamics with this combination. However, the combination of different adhesion and noble materials with the intermediate buffer layer(s) 119 to reduce or eliminate diffusion between adhesion layers 116 and noble layers 117, along with the annealing stage(s) produced positive effects with regard to stability of resistance behavior.

Other variations and examples of the heater-sensor dies 111 can comprise any suitable patterning configuration, any suitable arrangement of insulating layer(s) 112 and heating region(s) 113, any suitable combination of adhesion, buffer, and/or noble layers 116, 119, 117, and/or any suitable annealing or other process that facilitates stabilization of resistance behavior in the set of heater-sensor dies 110.

1.1.1 Heater-Sensor Theory

In the specific examples described above, the microfabricated heater-sensor dies 111 of the set of heater-sensor dies 110 are configured in a manner that produces rapid thermocycling for a given level of power input. Design of the pattern 313 of heater-sensor dies 111 in the specific examples was performed using a layout editor (e.g., Mentor Graphics™ or L-Edit™), in order to generate the boustrophedonic structures of the local morphology of the heater elements 114, within the bounds of the global circular morphology of the heater elements 114. Estimates of the electrical resistance of both thin-film heating elements 114 and sensing elements 115 (e.g., RTDs) of the specific examples was performed based upon a determination of sheet resistances of the thin film layer(s) of the adhesion and noble layers 116, 117 being deposited upon the insulating layer 112, with thicknesses of the thin film layers ranging from 50 nm-500 nm. In the specific example, sheet resistances were calculated based on the resistivity of the thin film and the width, thickness, and length of the thin film regions of the adhesion and noble layers 116, 117 being deposited. As such, in the specific examples, the layouts of the heating and sensing element 114, 115 patterns are configured to obtain desired heater-sensor coverage on a region (e.g., a region proximal to a surface of a sample container) being thermally cycled. In the specific examples, the configuration of the heater-sensor dies 111 also ensures that electrical resistance values of the heater-sensor dies are in within a desireable range, from an energy-use standpoint (e.g., a range that enables a range of temperatures with a low input voltage).

Theoretically, the resistance(s) of the heating element(s) 114 are preferably in the range of 50-100Ω to enable efficient heating of a substrate with an input voltage from 20-30 volts; however, the heating elements 114 can alternatively be characterized by other resistance ranges. A heating element 114 design characterized by a resistance between 50-100Ω and that uses an input voltage of 20-30 volts provides a dissipation of 4-18 Watts of heat and is capable of rapidly heating a desired region of a thermally conductive substrate (e.g., silicon substrate). In addition, such a design parameters can produce a temperature across a 1 cm×1 cm substrate that equilibrates and produces a uniform temperature profile in a diffusion time of less than 1 second. Such a diffusion time thus enables well-controlled biochemical reactions, with regard to temperature uniformity and control.

Theoretically, the resistance(s) of the sensing element(s) 115 (e.g., RTD) are preferably in the range 200-300Ω, based upon correlating a "change in resistance" (dependent upon TCR) against the temperature of the sensing element 115. In one variation, the resistance behavior of an RTD can be characterized by the following equation:

$$R=Ro*(1+\alpha*\Delta T+\beta*\Delta T^2)$$

where R=Resistance of an RTD at an unknown temperature (T); Ro=Resistance of temperature at a reference temperature To (e.g., room temperature); $\alpha$ and $\beta$=experimentally determined constants; and $\Delta T$=Difference in temperature (T−To). Under this equation, the change in resistance ($\Delta R$) for an RTD per degree change ($\Delta T$=1) is given by $\Delta R=(\alpha+\beta)*Ro$.

As such, for efficient temperature sensing as well as ensuring a detected temperature resolution of 0.1-0.2 C using RTDs, the resistance change per degree change in temperature is preferably greater than ~0.1Ω. While higher changes in resistance can be desired, such higher changes in temperature, for a given RTD material or thin film combination, results only when the initial resistance (Ro) of the RTD is substantially high. However, having a substantially high initial resistance increases the risk of the RTD selfheating during the resistance sensing process, thereby potentially causing additional noise/disturbances and inaccuracies in temperature measurement. The RTDs in a specific example of the system 100 were calibrated by measuring the resistance against 4-5 temperature points in the range the sensor is intended to be utilized. For biochemical assays, the typical range of temperatures is room temperature (25° C.) to ~100° C. By characterizing the resistance (R) at each of several temperatures (T) within a range of intended operation, one can obtain an experimental relationship for R vs. T.

1.2 Other System Elements

As shown in FIGS. 1, 4A-4B, and 7A-7C, the system 100 can further comprise an electronics substrate 140 configured to couple heating and sensing elements of the set of heater-sensor dies to a controller 165, a set of heat-sink supports 150 configured to facilitate heat dissipation within the system 100, a set of elastic elements 160 configured to bias the set of heater-sensor dies 110 against detection chambers for sample processing, and can additionally comprise the controller 165 and/or a cooling subsystem 170.

Figure 4A:
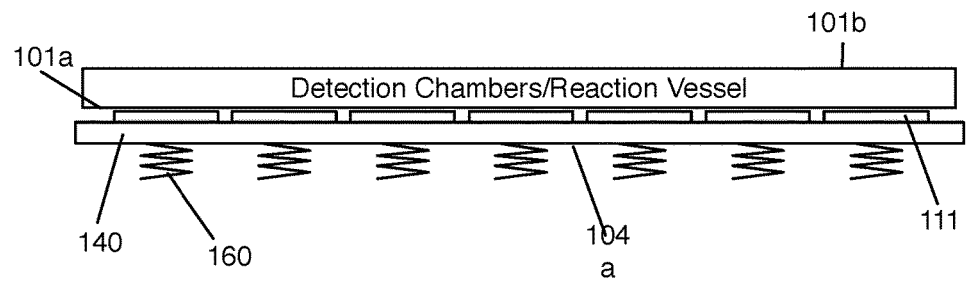
FIGS. 4A and 4B depict examples of additional elements of an embodiment of a thermocycling system.
Figure 4B:
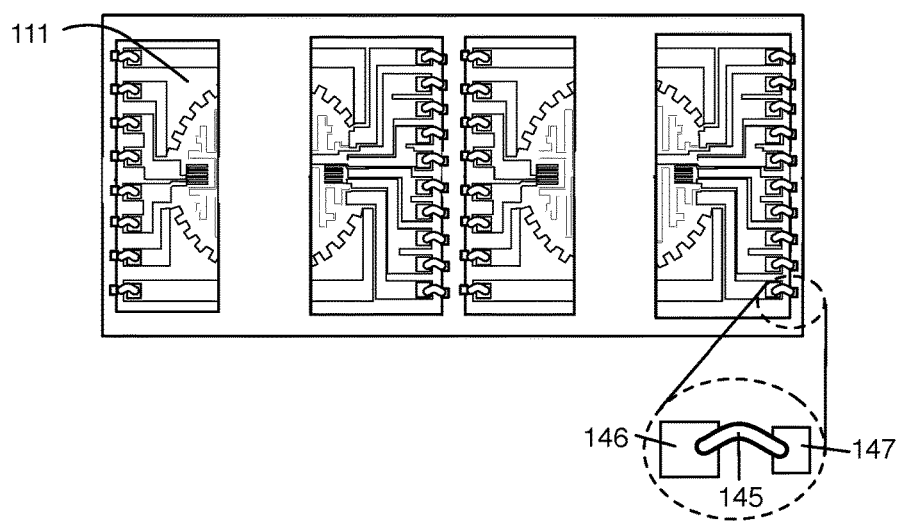

The electronics substrate 140 is preferably coupled to the set of heater-sensor dies 110, and functions to enable communication between heating elements 114 and sensing elements 115 of each heater-sensor die 111 in the set of heater-sensor dies 110 and a controller 165. As such, the electronics substrate preferably enables communication of heat output commands from the controller 165 to the heating element(s) 114, and communication of heating parameters (e.g., detected temperatures) sensed at the sensing element(s) 115 to the controller 165. The electronics substrate 140 preferably comprises a printed circuit board (PCB), and in one variation is a flexible PCB, as shown in FIG. 4A, in order to facilitate contact between heater-sensor dies 111 in the set of heater-sensor dies 110 and detection chambers (e.g., reaction vessels, sample containers, etc.) for processing of a sample according to molecular diagnostic protocols. Alternatively, the PCB can be a substantially rigid PCB or any other suitable PCB.

Figure 5A:
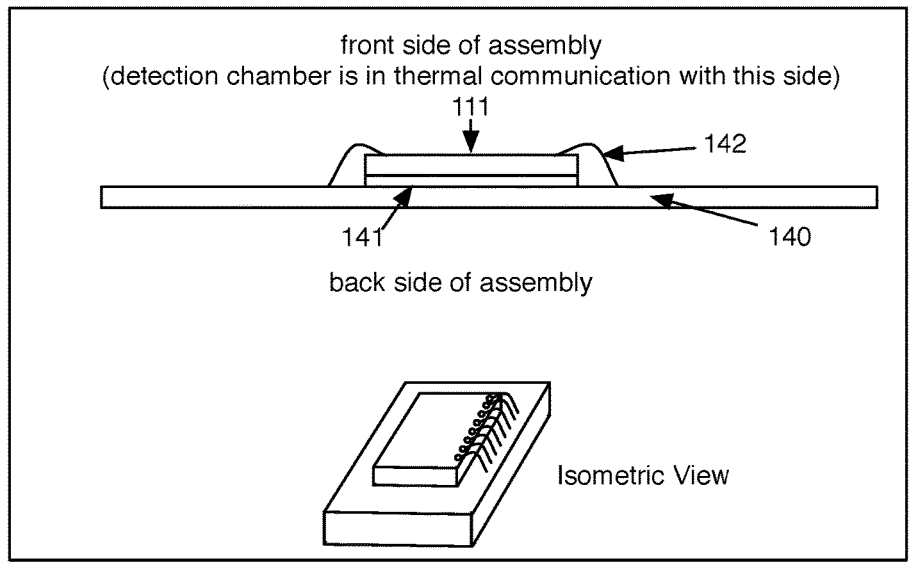
FIGS. 5A and 5B depict variations of configurations of elements in an embodiment of a thermocycling system.
Figure 5B:
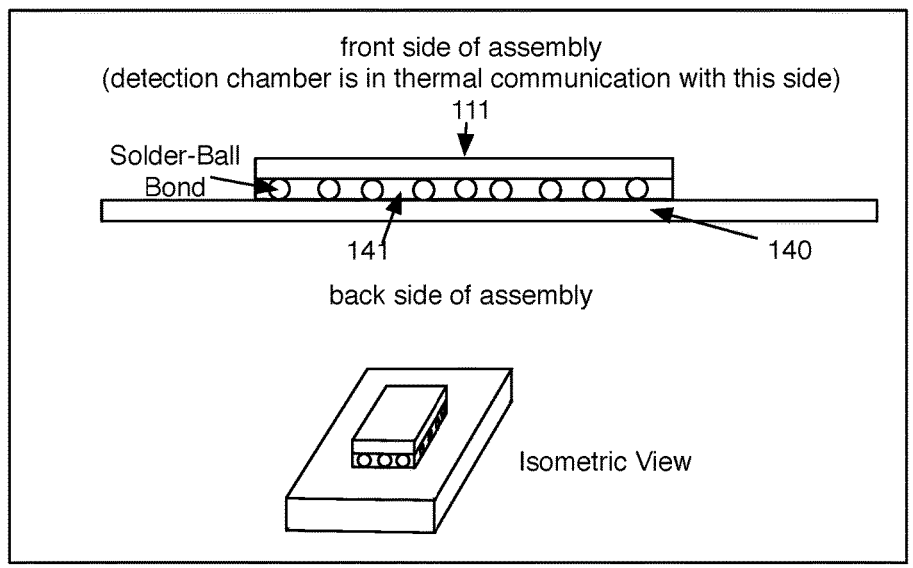

Preferably, the set of heater-sensor dies 110 is coupled to the electronics substrate 140 in a manner that provides thermal and/or electrical isolation of each heater-sensor die 111 from the neighboring heater-sensor die(s) due to poor conductivity of the electronics substrate 140. However, the electronics substrate 140 and the set of heater-sensor dies 110 can be configured in any alternative suitable manner that provides isolation of each heater-sensor die 111. In some variations, each heater-sensor die 111 is coupled to the electronics substrate by an adhesive layer 141 and/or a wire bond 142, as shown in FIG. 5A; however, each heater-sensor die 111 can alternatively or additionally be coupled to the electronics substrate 140 in any suitable manner (e.g., using solder bonds in flip-chip bonding), as shown in FIG. 5B. Furthermore, the system 100 can comprise any suitable number of electronics substrates.

Figure 6A:
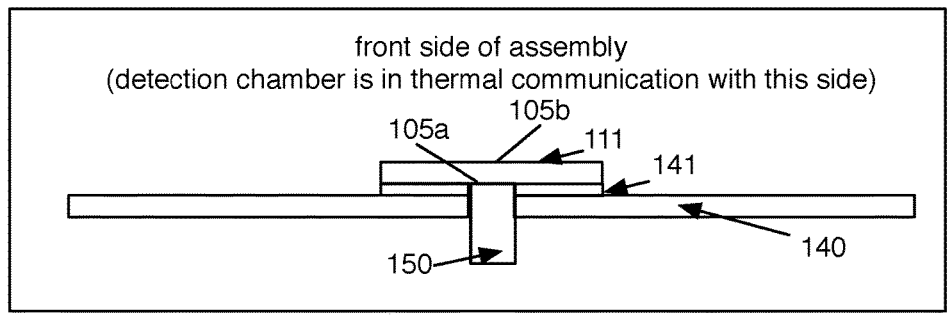
FIGS. 6A and 6B depict variations of configurations of elements in an embodiment of a thermocycling system.
Figure 6B:
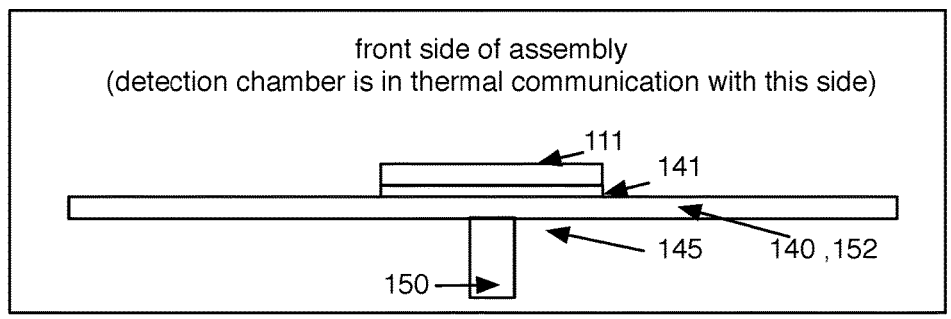

The set of heat sink supports 150 is preferably coupled to at least one of the set of heater-sensor dies 110 and the electronics substrate 140 and functions to facilitate rapid thermocycling by dissipating heat from the set of heater-sensor dies 110 and/or the electronics substrate 140. The set of heat sink supports 150 can further function to provide structural support for the set of heater-sensor dies 110, such that the set of heater-sensor dies 110 is supported during compression (e.g., compression against a set of detection chambers) and/or tension. In the absence of heat sinking, the electronics substrate 140 and the surrounding environment can potentially retain too much heat, which compromises the cooling of the set of heater-sensor dies 110. The set of heat sink supports 150 can comprise multiple heat sink supports 151 configured to define any suitable number of contact locations, or can alternatively comprise a single heat sink support 151 configured to define any suitable number of contact locations. As shown in FIGS. 6A and 6B, the system 100 preferably couples to a detection chamber (e.g., reaction vessel, detection chamber) at a first side 101a of the detection chamber, as shown in FIG. 4A, which can restrict heat dissipation from the first side 101a of the system. Furthermore, the second side 101b of the detection chamber is typically used for optical imaging for monitoring (e.g., realtime monitoring, delayed monitoring), and further limiting heat-sinking from the second side 101b. Thus, it is preferable for the set of heat sink supports 150 to couple to the system 100 from a side of the system 100 that does not physically interfere with optical imaging apparatus interfacing with the system 100. However, alternative configurations of the set of heat sink supports 150 can comprise coupling at any suitable side and/or any number of sides of the system 100.

As shown in FIGS. 6A and 6B, the set of heat sink supports 150 can be configured in any of a number of variations. In a first variation, each heat sink support 151 can be directly placed against a first surface 105a of heater-sensor die 111 opposing that of a second surface 105b contacting a detection chamber, as shown in FIG. 6A. The first variation enables efficient transfer of heat out of the first surface 105a of the heater-sensor die away from a respective detection chamber; however, excessive heat sinking can affect heating ramp rates. In a second variation, the system 100 comprises a thermally insulating assembly 152 between a heater-sensor die 111 and a corresponding heat sink support 151, as shown in FIG. 6B. In the second variation, the electronics substrate 140 can serve as the thermally insulating assembly 152 and can be situated between the heater-sensor die 111 and a heat sink support 151. Furthermore, in the second variation, a suitable thermal resistance provided by the electronics substrate 140 (e.g., through thickness, material selection, a combination of features) could produce a thermal couple between the heater-sensor die 111 and the heat sink support 151 to permit the heating capacity of the heater-sensor die 111 to achieve the heating times and/or heating ramp rate required by the application, while still allowing adequate cooling rates. Additionally, the second variation can provide increased backside support to each of the set of heater-sensor dies 110 as well as increased surface for adhesion.

In specific examples of the second variation, heat sinking and supporting the "backside" of the electronics substrate 140 can be implemented across multiple heater-sensor dies 111, separated by Society for Laboratory Automation and Screening (SLAS) standard spacings, such as 9 mm, 4.5 mm or 2.25 mm spacings. The heat sink support 151 material (e.g., aluminum, copper, silver) in the specific examples is mated with the electronics substrate 140 at each heater-sensor die location, with an air gap positioned laterally between each heater-sensor die location. This configuration can further function to reduce cross talk across a set of detection chambers in contact with the set of heater-sensor dies 110. The set of heat sink supports 150 can, however, be configured in any other suitable manner to provide heat dissipation within the system 100, without obstruction of optical detection apparatus, and with provision of desired heat ramping and/or cycling behavior.

The set of elastic elements 160 is preferably coupled to a first surface 104a of the electronics substrate 140, as shown in FIG. 4A, and functions to promote contact between the set of heater-sensor dies 110 and detection chambers (e.g., reaction vessels, detection chambers) for sample processing according to molecular diagnostic protocols. The set of elastic elements 160 can comprise any one more of springs and elastomeric elements, which can deform and provide transmit a biasing force, through the electronics substrate 140, to reinforce contact between a set of detection chambers and the set of heater-sensor dies 110. The set of elastic elements 160 can, however, additionally or alternatively include any other suitable elements configured to provide a biasing force that reinforces contact between a set of detection chambers and the set of heater-sensor dies 110 in an elastic or a non-elastic manner. In one such alternative variation, the system 100 can include one or more actuators configured to drive each of the set of heater-sensor dies 111 toward a corresponding detection chamber, and in another such alternative variation, the system 100 can include a set of magnets (e.g., including magnet pairs surrounding the set of heater-sensor dies 110 and a corresponding set of detection chambers), that function to reinforce coupling between the set of heater-sensor dies 110 and the set of detection chambers. However, any other suitable elements can additionally or alternatively be used to facilitate uniform and consistent coupling between the set of heater-sensor dies 110 and a set of detection chambers.

In embodiments of the system 100 including a set of elastic elements 160, the set of elastic elements 160 is preferably coupled to a first surface 104a of the electronics substrate 140, such that each elastic element in the set of elastic elements 160 facilitates contact between a heater-sensor die 111 and a corresponding detection chamber. In a first variation, the set of elastic elements 160 is coupled to first surface 104a of a flexible PCB of the electronics substrate 140, as shown in FIG. 4A. In the first variation, contact between each heater-sensor die 111 and a corresponding detection chamber is thus maintained by a biasing force provided by an individual spring through the flexible PCB of the electronics substrate 140. In the first variation, the number of elastic elements in the set of elastic elements 160 is equal to the number of heater-sensor dies in the set of heater-sensor dies 110, such that the set of elastic elements 160 and the set of heater-sensor dies 110 are paired in a one-to-one manner. Alternatives to the first variation can, however, comprise any suitable number of elastic elements in relation to a number of heater-sensor dies 110. In a second variation, the set of heater-sensor dies 110 is coupled to a second surface 104b of a rigid PCB of the electronics substrate 140, with the set of elastic elements 160 coupled to the first surface 104a of the rigid PCB. In the second variation, the set of elastic elements 160 thus functions to collectively transfer a force through the rigid PCB to maintain contact between the set of heater-sensor dies 110 and the detection chambers. Alternatives to the second variation can also comprise any suitable number of springs in relation to a number of heater-sensor dies in the set of heater-sensor dies 110. Furthermore, variations of the system 100 can include one or more elastic elements coupled to any other elements directly or indirectly coupled to the set of heater-sensor dies 110. For instance, the system 100 can additionally or alternatively include one or more springs 160' coupled to base surfaces of the set of heat-sink supports 150 interfacing with the set of heater-sensor dies, in order to transmit biasing forces.

As shown in FIGS. 1A and 1B, the system 100 can further comprise a controller 165, which functions to automate and/or control heating parameters provided by the set of heater-sensor dies 110. The controller 165 can further be configured to provide heat parameter output commands to the heating element(s) 114, and/or configured to receive communication of heating parameters (e.g., detected temperatures) sensed at the sensing element(s) 115 of the system 100. The controller 165 preferably comprises a proportion-integral-derivative (PID) controller, but can alternatively be any other suitable controller 165. The controller 165 preferably interfaces with the set of heater-sensor dies 110 through the electronics substrate 140 by a connector; however, the controller 165 can interface with the set of heater-sensor dies 110 in any alternative suitable manner. Preferably, the controller 165 is configured to automate and control heat output parameters, including any one or more of: heating temperatures, heating ramp rates, heating times (e.g., holding times), and any other suitable heating parameter(s). Furthermore, the controller 165 can be configured to control individual heater-sensor dies 111 in order to provide unique heating parameters for individual detection chambers and/or can be configured to provide common heating parameters for all heater-sensor dies 111 in the set of heater-sensor dies 110. In a specific example, the controller 165 comprises a Yokogawa UT750 PID controller, an Arduino UNO R3 microcontroller configured to cycle the UT750 through temperature stages and to control temperature holding, a resistance-to-voltage conversion circuit, and two power supplies—a first power supply configured to supply power to the set of heater-sensor dies 110 and a second power supply configured to supply voltage to the resistance-to-voltage conversion circuit. In the specific example, the controller 165 comprises a resistance-to-voltage conversion circuit because the UT750 PID controller requires voltage as an input for PID control. In another specific example, the controller 165 comprises a National Instruments LabView based system comprised of an NI cDAQ-9178 chassis with an NI 9219 universal analog input card and an NI 9485 eight-channel solid-state relay sourcing or sinking digital output module solid-state relay card. In this specific example, the cDAQ-9178 supports the NI 9219 and NI 9485 cards, the NI 9219 is used to obtain the RTD inputs, and the NI 9485 cycles the power supply voltage to individual heater-sensor dies of the set of heater-sensor dies 110. Further, in this specific example, the controller 165 is expandable to 12 or more channels through the use of additional NI 9219 and NI 9485 cards, each of which can handle several channels.

Figure 7A:
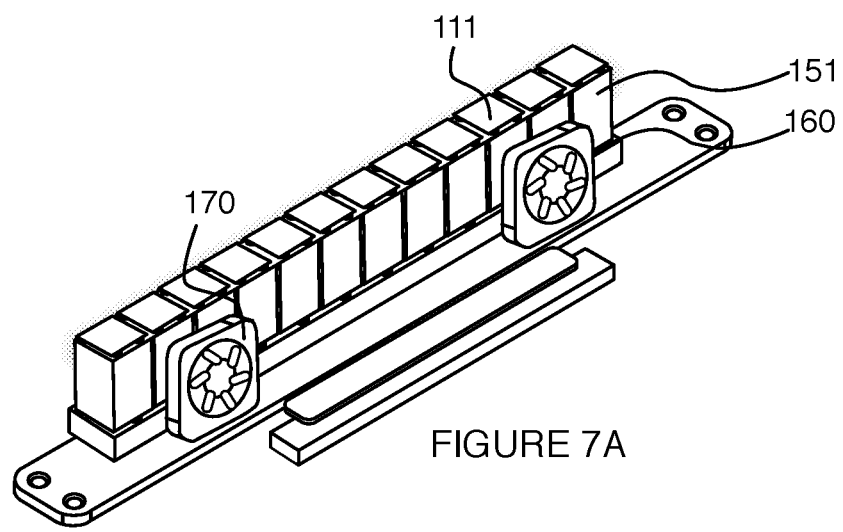
FIGS. 7A-7C depict variations in configurations of additional elements in an embodiment of a thermocycling system.
Figure 7B:
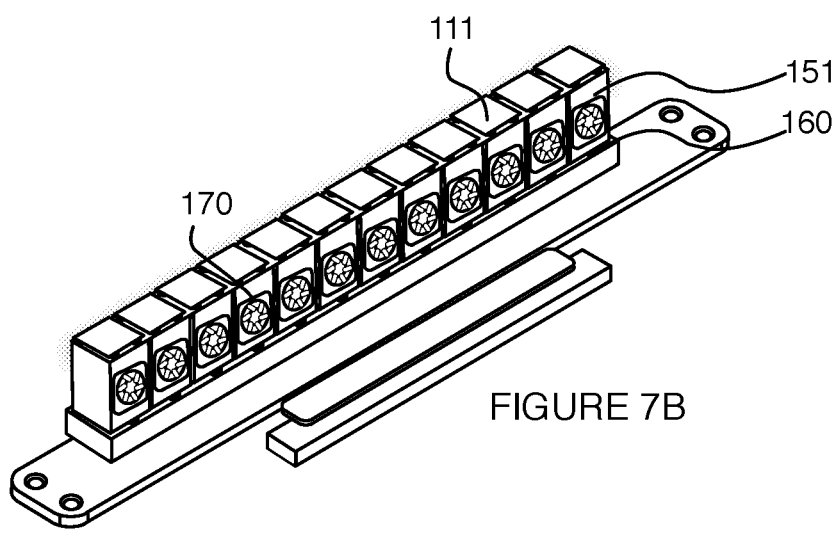
Figure 7C:
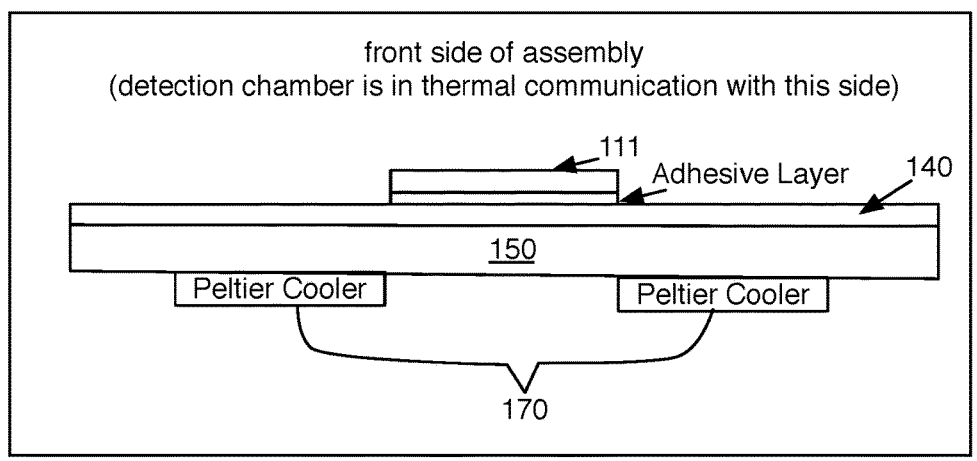

As shown in FIGS. 8A and 8B, the system 100 can further comprise a cooling subsystem 170, which functions to provide heat transfer from the system 100 in order to further enhance controlled heating and cooling by the system 100. The cooling subsystem 170 is preferably configured to provide at least one of convective cooling and conductive cooling of the system 100, but can alternatively be configured to provide any other suitable cooling mechanism or combination of cooling mechanisms. In one variation, the cooling subsystem 170 can comprise a fan 171 that provides convective heat transfer from the system 100. In this variation, the fan 171 can be coupled to any suitable element of the system 100, such as the set of heat sink supports 150, as shown in A. Furthermore, alternatives to this variation can comprise any suitable number of fans of any suitable dimension and configuration, examples of which are shown in FIGS. 7A and 7B. In one such example, the system can include a set of cooling elements integrated with each heat sink support of the set of heat sink supports. In another variation, the cooling subsystem 170 can additionally or alternatively comprise a Peltier device, as shown in FIG. 7C. The Peltier device can be cooled and maintained at a defined temperature (e.g., in the 10-25 C range) to provide a substantial temperature gradient for cooling during a thermal cycling process, which can decrease cooling times and/or cycle times. In yet another variation, the cooling subsystem 170 can additionally or alternatively comprise a liquid cooling system (e.g., water cooling system) configured to surround and absorb heat from one or more heater-sensor dies of the set of heater-sensor dies 110, for instance, by way of the set of heat sink supports 150. The cooling subsystem 170 can additionally or alternatively comprise any other suitable cooling element(s).

In some variations, reflection from the set of heater-sensor dies 110 can interfere with light transmitted to photodetectors of an optical subsystem opposed (e.g., directly opposed, in opposition) to the set of heater-sensor dies 110 (e.g., light emitted from the set of biological samples, light transmitted through filters of an optical subsystem), especially in configurations wherein a set of detection chambers is configured between the set of heater-sensor dies and optical elements of an optical subsystem. In these variations, the set of heater-sensor dies 110 can include elements that reduce or eliminate reflection from any portion of the set of heater-sensor dies (e.g., reflection from the heating region, etc.), thereby facilitating analysis of a set of biological samples within the set of detection chambers. In one variation, the set of heater-sensor dies 110 can include or be coupled to one or more non-reflective coatings 180 at surfaces of the set of heater-sensor dies 110 upon which light from the optical subsystem impinges. In a specific example, the non-reflective coating 180 can comprise a high-temperature paint (e.g., dark paint, flat paint) that functions to absorb and/or diffuse light from an opposing optical subsystem, while facilitating heat transfer to a set of detection chambers in thermal communication with the set of heater-sensor dies 110. In another variation, the set of heater-sensor dies 110 can be configured to be in misalignment with photodetectors of the optical subsystem, such that reflection does not interfere with light transmitted to the photodetectors of the optical subsystem. In one example, the set of heater-sensor dies 110 can be configured to heat a set of detection chambers from a first direction, and the optical subsystem can be configured to receive light from the set of detection chambers from a second direction (e.g., a direction non-parallel to the first direction), such that reflection from the set of heater-sensor dies 110 does not cause interference. In still other variations, the set of heater-sensor dies 110 can include any other suitable elements (e.g., coatings, layers, etc.) and/or be configured in any other suitable manner that eliminates, prevents, or mitigates reflection from the set of heater-sensor dies 110 from interfering with light transmitted to photodetectors of an optical subsystem in opposition to the set of heater-sensor dies 110.

Variations of the system 100 can, however, include any other suitable element(s) configured to provide uniform, accurate, precise, and reliable heating of one or more detection chambers in thermal communication with the system 100. Furthermore, as a person skilled in the art will recognize from the previous detailed description and from the figures, modifications and changes can be made to the preferred embodiments of the system 100 without departing from the scope of the system 100.

2. Method of Manufacture

Figure 8:
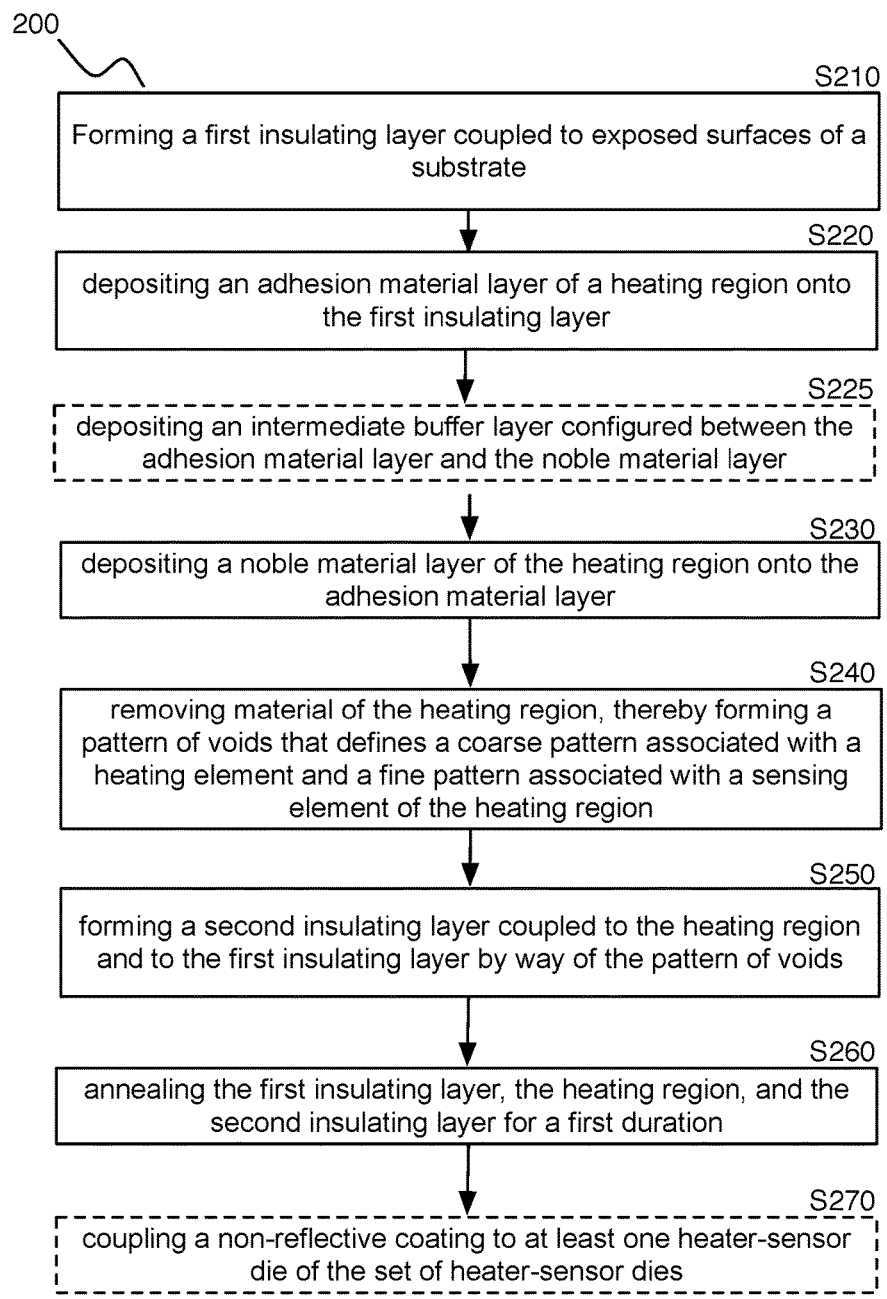
FIG. 8 depicts a schematic of an embodiment of a method for manufacturing a thermocycling system.

As shown in FIG. 8, a method 200 of manufacturing a system for thermocycling biological sample within detection chambers comprises: forming a first insulating layer coupled to exposed surfaces of a substrate S210; depositing an adhesion material layer of a heating region onto the first insulating layer of the substrate S220; depositing a noble material layer of the heating region onto the adhesion material layer S230; removing material of the heating region S240, thereby forming a pattern of voids that defines a coarse pattern associated with a heating element of the heating region and a fine pattern, integrated into the coarse pattern and associated with a sensing element of the heating region; forming a second insulating layer coupled to the heating region and to the first insulating layer by way of the pattern of voids S250; and annealing the first insulating layer, the heating region, and the second insulating layer for a first duration S260.

The method 200 functions to generate heating and sensing elements of a thermocycling system that can provide rapid thermocycling without significant power requirements, while ensuring a suitably close correlation between an actual heating temperature and a temperature set-point (i.e., an intended heating temperature). In some embodiments, the method 200 can function to produce a heating and sensing element of an integrated heater-sensor die as described in Section 1 above, which can controllably and individually heat small sample volumes (e.g., picoliters, nanoliters, microliters). Furthermore, the method 200 of manufacture preferably implements a priori predictions of electrical resistance values of thin film combinations of the set of heater-sensor dies 110, as described in Section 1 above, and accounts for and/or prevents signal drift in relation to actual and intended heating temperatures, to maintain controlled sample heating.

Block S210 recites: forming a first insulating layer coupled to exposed surfaces of a substrate, which functions to electrically isolate portions of a heating region from other elements of the thermocycling system. The substrate is preferably a silicon substrate, but can alternatively be any other suitable semi-conducting, or non-conducting substrate. As such, in variations, the substrate can be composed of a semi-conducting material (e.g., silicon, quartz, gallium arsenide), and/or an insulating material (e.g., glass, ceramic). In some variations, the substrate 130 can even comprise a combination of materials (e.g., as in a composite, as in an alloy). In examples wherein the substrate is a silicon substrate, the substrate can be composed of silicon with any suitable type (e.g., P-type), doping (e.g., boron-doping), miller index orientation, resistivity, thickness, total thickness variation, and/or polish.

In forming the first insulating layer, Block S210 can be performed using any one or more of: thermal oxide growth, chemical vapor deposition (CVD), spin coating, spray coating, and any other suitable method of depositing a localized layer of an insulating material. Preferably, the first insulating layer is composed of an insulating oxide material, and in examples can include any one or more of: a thermally grown silicon oxide, a chemical vapor deposited oxide, a deposited titanium oxide, a deposited tantalum oxide, and any other suitable oxide grown and/or deposited in any other suitable manner. However, the first insulating layer can additionally or alternatively include an insulating polymer (e.g., a polyimide, a cyanate ester, a bismaleimide, a benzoxazine, a phthalonitrile, a phenolic, etc.) that is chemical and heat resistant and/or any other suitable material (e.g., chemical vapor deposited nitride, other nitride, paralene, etc.) that is configured to provide the first insulating layer.

In one example of Block S210, the first insulating layer comprises an oxide material, and is formed by growing the oxide material on a substrate. In one example of Block S210, the insulating layer comprises a 0.2 mm layer of silicon oxide, and is formed on a 100 mm silicon wafer using thermal oxidation at 900° C. using water vapor (i.e., in wet oxidation) or oxygen (i.e., in dry oxidation) as the oxidant. In alternative variations and examples of Block S210, the first insulating layer can be formed using high or low temperature thermal oxidation, using any suitable oxidant, and/or using any other suitable method (e.g., fluid deposition of an electrically insulating polymer, softbaking/hardbaking of a deposited polymer, etc.).

Block S220 recites: depositing an adhesion material layer of a heating region onto the first insulating layer of the substrate, which functions to facilitate bonding of a noble material layer of the heating region to the first insulating layer as in Block S230. The adhesion material preferably comprises an adhesion material that is characterized as active in reacting with the first insulating layer, in order to facilitate coupling between the first insulating layer and the adhesion material. However, the adhesion material of the adhesion material layer can additionally or alternatively have any other suitable characteristic(s). In variations wherein the first insulating layer comprises an insulating oxide, the adhesion materials used in the adhesion material layer(s) can comprise materials that are oxygen-active to chemically react with an oxide surface (e.g., materials that have a high heat of oxide formation). In examples of oxygen-active materials, the adhesion material layer can be composed of any one or more of: chromium, titanium, niobium, vanadium, any other suitable adhesion material that reacts with the insulating layer, and any combination or alloy of any of the above materials.

In Block S220, the adhesion material layer is preferably coupled to the first insulating layer by one or more of evaporation and sputtering. However, in alternative variations, the adhesion material layer can be coupled to the first insulating layer by any one or more of: deposition (e.g., electrodeposition, CVD, etc.), plating (e.g., chemical plating, electroplating), and any other suitable process of coupling the adhesion material layer to the first insulating layer. Furthermore, in examples wherein the adhesion material layer is evaporated or sputtered, the insulating layer-substrate subassembly generated in Block S210 can be translated or rotated in order to facilitate uniform deposition of the adhesion material layer. In Block S220, the adhesion material layer is preferably processed to a thickness of under 100 nm; however, the adhesion material layer can alternatively be processed to any other suitable thickness. In specific examples, the adhesion material layer comprises a 50 nm thick layer of chromium, or a 50 nm thick layer of a combination of titanium and tungsten.

Block S230 recites: depositing a noble material layer of the heating region onto the adhesion material layer, which functions to form a portion of a heating region comprising a heating element and a sensing element of the system. The noble material preferably comprises a noble material that is characterized as having good thermal conductivity and affinity to coupling with the adhesion material layer in a reliable manner during thermocycling of the system. The noble material layer can alternatively have characteristics including any one or more of: characteristics that inhibit diffusion between the adhesion material layer and the noble material layer, high fatigue resistance, high fracture resistance, and any other suitable property that provides reliability during thermocycling of the system. In examples of noble materials that operate well with examples of adhesion materials described above, the noble material layer can be composed of any one or more of: gold, platinum, tungsten, palladium, any other noble material that interacts well with the adhesion material layer, and any combination or alloy of any of the above materials.

In Block S230, the noble material layer is preferably coupled to the adhesion material layer by one or more of evaporation and sputtering. However, in alternative variations, the noble material layer can be coupled to the adhesion material layer by any one or more of: deposition (e.g., electrodeposition, CVD, etc.), plating (e.g., chemical plating, electroplating), and any other suitable process of coupling the noble material layer to the adhesion material layer. Furthermore, in examples wherein the noble material layer is evaporated or sputtered, the adhesion material layer—insulating layer-substrate subassembly generated in Block S220 can be translated or rotated in order to facilitate uniform deposition of the noble material layer. In Block S230, the noble material layer is preferably processed to a thickness of under 500 nm; however, the noble material layer can alternatively be processed to any other suitable thickness. In specific examples, the noble material layer comprises a 200 nm thick layer of gold, a 300 nm thick layer of gold, a 440 nm thick layer of gold, and/or a 100 nm thick layer of platinum.

In some variations, the method 200 can further include Block S225, which recites: depositing an intermediate buffer layer configured between the adhesion material layer and the noble material layer. Block S225 functions to provide a layer that reduces or prevents diffusion between the noble material layer and the adhesion material layer, thus improving dynamic stability (e.g., in electrical resistance behavior) of the system. In variations, the intermediate buffer layer thus has characteristics that contribute to behavior as a barrier against diffusion between the adhesion material layer and the noble material layer. In examples, the intermediate buffer layer comprises platinum and/or titanium, and can be processed onto an adhesion material layer by one or more of evaporation and sputtering. However, in alternative variations, the intermediate buffer layer can be coupled to the adhesion material layer by any one or more of: deposition (e.g., electrodeposition, CVD, etc.), plating (e.g., chemical plating, electroplating), and any other suitable process of coupling the intermediate buffer layer to adhesion material layer, prior to coupling of noble material layer to the intermediate buffer layer. The intermediate buffer layer is preferably processed to a thickness of less than 150 nm, and in specific examples can comprise a 100 nm thick layer of platinum, or a 50 nm thick layer of titanium. However, the intermediate buffer layer can alternatively have any other suitable thickness. Furthermore, variations of the heating region 113 comprising adhesion material layers and noble material layers can include any suitable number of adhesion material layers, noble material layers, and intermediate buffer layers that prevent diffusion between an adhesion material layer into an adjacent noble material layer, wherein each layer can have any other suitable thickness.

Block S240 recites: removing material of the heating region, which functions to form a pattern of voids that defines a coarse pattern associated with a heating element of the heating region and a fine region, integrated into the coarse pattern and associated with a sensing element of the heating region. Block S240 functions to produce elements of the heating region with desired resistance behavior and characteristics, in order to provide reliable and accurate heat parameter sensing and output within the system. Block S240 preferably provides one or more heating elements and sensing elements integrated with the heating elements, wherein the heating element(s) and the sensing element(s)

have desired theoretical resistance characteristics as described in Section 1.1.1 above; however, Block S240 can alternatively provide heating elements and sensing elements with any other suitable resistance characteristics.

Block S240 preferably produces a pattern of voids having geometric features (e.g., width, thickness, length, spacing) that facilitate uniform heating and provide desired heating and sensing characteristics (e.g., resistance characteristics). In some variations, the pattern of voids can define any one or more of: linear segments, non-linear segments, boustrophedonic segments, continuous segments, non-continuous segments, and any other suitable segment(s) having any other suitable geometry (i.e., width, depth, height, length, path, etc.) within an assembly of the adhesion material layer(s), noble material layer(s), and/or intermediate buffer layer(s) produced in Blocks S220, S230 and/or S225. The pattern of voids produced in Block S240 can further be symmetric about any suitable reference (e.g., reference line, reference plane, etc.), or can alternatively be non-symmetric. Furthermore, in some variations, the pattern of voids can define a global morphology (e.g., circular footprint, ellipsoidal footprint, polygonal footprint, etc.) at a first scale (e.g., macroscopic scale) but have a local morphology at a second scale (e.g., microscopic scale), wherein the local morphology provides desired characteristics (e.g., resistance characteristics) that are attributed to elements (e.g., heating elements, sensing elements) of the heating region. As such, the global morphology can provide conformation (e.g., in shape) between the heating region and a detection chamber configured to contact the heating region, and the local morphology can provide uniform heating and/or accurate sensing of heating parameters by utilizing structural features having a smaller governing dimension.

The pattern of voids is preferably defined entirely through the assembly of the adhesion material layer(s), noble material layer(s), and/or intermediate buffer layer(s) produced in Blocks S220, S230 and/or S225 (e.g., through the assembly to the first insulating layer); however, the pattern of voids can alternatively be defined to any other suitable thickness through the assembly. Preferably, Block S240 includes producing the pattern of voids by way of a lithographic process (e.g., lithographic process with a positive resist, lithographic process with a negative resist). However, producing the pattern of voids in Block S240 can additionally or alternatively be performed using any one or more of: etching, punching, die-cutting, water cutting, laser cutting, and any other suitable method of removing material. In one example, the assembly comprising the adhesion material layer and the noble material layer produced in examples of Blocks S220 and S230 can be covered with positive photoresist (e.g., a photomask designed according to the heating pattern) and lithographically etched in exposed regions. In the example, the positive photoresist can then be removed to reveal the pattern of voids. In other variations of the example, the pattern of voids can be produced using any lithographic method, using positive and/or negative etching to form the heating pattern, and/or using any other suitable method. In one example of an alternative implementation of Step S240', the pattern of voids can be produced using a lift-off process, wherein a sacrificial layer is used to define the pattern of voids, the heating region material(s) is (are) deposited, and then the sacrificial layer is removed to reveal the heating pattern.

In a specific example of Block S240, an assembly comprising an adhesion material layer, a noble material layer, and an intermediate buffer layer configured between the adhesion material layer and the noble material layer is configured to have a global footprint defining circular region having a diameter of 5 mm. The pattern of voids, produced by a lithographic process, defines three heating elements including: a central circular heating element and two circumferential heating elements, as shown in FIG. 3, configured to form a boundary with a serpentine-shaped pattern about the central circular heating element. In the specific example, the two circumferential heating elements are each configured to form a semicircular perimeter about the central circular heating element. The pattern of voids produced in the specific example of Block S240 further comprises three integrated sensing elements (i.e., resistance temperature sensors, RTDs) distributed at three locations within the 5 mm circular footprint. In the specific example, the pattern of voids was designed using a layout editor (e.g., Mentor Graphics™ or L-Edit™), to define the heating elements and the sensing elements according to desired resistance characteristics as described in Section 1.1.1 above. The specific example of Block S240 produced heating elements having coarse patterning, and sensing elements 115 integrated with the heating elements and having fine patterning, as shown in FIGS. 3A and 3B. Variations of the specific example of Block S240 can, however, generate any other suitable pattern of voids to define the heating element(s) and the sensing element(s) in any other suitable manner.

Blocks S210, S220, S230, and S240 are preferably performed in the order described; however, Blocks S210, S220, S230, and S240 can alternatively be performed in any other suitable order. For instance, in one variation the patterned assembly comprising the adhesion material layer(s), the noble material layer(s), and/or the intermediate buffer layer(s) can be formed by any suitable method (e.g., molding, laser cutting, stamping, 3D printing, stereolithography, etc.) and then coupled to the first insulating layer according to any suitable manner.

Block S250 recites: forming a second insulating layer coupled to the heating region and to the first insulating layer by way of the pattern of voids, which functions to electrically isolate portions of a heating region from other elements of the thermocycling system, and to further provide stability within the system. In forming the second insulating layer, Block S250 is preferably performed using a deposition process (e.g., CVD); however, Block S250 can additionally or alternatively be performed using any one or more of: thermal oxide growth, spin coating, spray coating, and any other suitable method of depositing a localized layer of an insulating material. Preferably, the second insulating layer is composed of an insulating oxide material, and in examples can include any one or more of: a silicon oxide (e.g., deposited by CVD, thermally grown), a titanium oxide, a tantalum oxide, and any other suitable oxide grown and/or deposited in any other suitable manner. However, the first second layer can additionally or alternatively include an insulating polymer (e.g., a polyimide, a cyanate ester, a bismaleimide, a benzoxazine, a phthalonitrile, a phenolic, etc.) that is chemical and heat resistant and can be processed onto the first insulating layer and the heating region by any one or more of: casting (e.g., drop casting), printing, dipping, and using any other suitable method. The second insulating layer processed in Block S250 can additionally or alternatively comprise any other suitable material (e.g., chemical vapor deposited nitride, other nitride, paralene, etc.) that is configured to provide the second insulating layer.

Block S260 recites: annealing the first insulating layer, the heating region, and the second insulating layer for a first duration, which functions to stabilize dynamic resistance behavior of heating and sensing elements of the system.

Since a majority of changes in resistance (e.g., drift) come from thermal reactions, settling, diffusion, and improved adhesion, annealing can accelerate the processes that lead to changes in resistance, thus producing a system with stable resistance behavior (e.g., stable for 3-5 years) by driving dynamic processes toward an equilibrium state (or other stable state) prior to use of the system in sample-processing applications. In Block S260, annealing can comprise a single stage of annealing or multiple stages of annealing, and can additionally or alternatively comprise different conditions (e.g., temperatures, durations, environmental conditions) during the annealing stage(s). Preferably, annealing thus produces stable resistances that are substantially low (in order to enable driving of the system at low voltages) and have limited variability, indicating that underlying material dynamics have reached equilibrium.

In Block S260, annealing is preferably performed at constant temperature, and in variations, can be performed at a temperature between 300 C and 600 C (or any other suitable temperature below a melting temperature of the noble material layer and the adhesion material layer); however, annealing can alternatively be performed at any other suitable temperature or range of temperatures, and can additionally or alternatively be performed at a non-constant temperature (e.g., cyclically varying temperature, non-cyclically varying temperature). Annealing is preferably performed in an inert atmosphere (e.g., inert $N_2$ atmosphere) to control reactions between the atmosphere and elements being annealed; however, annealing can alternatively be performed in any other suitable atmosphere. In a specific example, Block S240 includes annealing the first insulating layer, the heating region, and the second insulating layer at 400 F in an inert $N_2$ atmosphere for one hour, which can, in some variations of the specific example, be extended for up to 2 hours following the first hour of annealing.

As shown in FIG. 8, the method 200 can further include Block S270, which recites: coupling a non-reflective coating to at least one heater-sensor die of the set of heater-sensor dies. Block S270 functions to process at least a subset of the set of heater-sensor dies 110 so that they do not interfere with light transmitted to photodetectors of an optical subsystem opposed (e.g., directly opposed, in opposition) to the set of heater-sensor dies 110 (e.g., light emitted from the set of biological samples, light transmitted through filters of an optical subsystem), especially in configurations wherein a set of detection chambers is configured between the set of heater-sensor dies and optical elements of an optical subsystem. The non-reflective coating is preferably coupled identically to all heater-sensor dies of the set of heater sensor dies; however, the non-reflective coating can alternatively be coupled non-identically to one or more heater-sensor dies of the set of heater-sensor dies. As such, in variations, one or more subsets of the set of heater-sensor dies can be coupled to non-reflective coatings in a manner that provides different light reflection properties for the subset(s) of the set of heater-sensor dies.

In Block S270, the non-reflective coating is preferably a material layer that is applied superficial to at least one of the first insulating layer and the second insulating layer processed in variations of Blocks S210 and S250, respectively. In one example, the non-reflective coating processed in Block S270 can comprise a high-temperature paint (e.g., dark paint, flat paint) that functions to absorb and/or diffuse light from an opposing optical subsystem, while facilitating heat transfer to a set of detection chambers in thermal communication with the set of heater-sensor dies. In this example, the high-temperature paint can be applied by any one or more of: brushing, spraying, dipping, printing, and any other suitable method of coupling the high-temperature paint to one or more surfaces of at least a subset of the set of heater-sensor dies. However, the non-reflective coating can alternatively be processed simultaneously with or can comprise one or more of the first insulating layer and the second insulating layer processed in variations of Blocks S210 and S260, respectively. For instance, one or more of the first and the second insulating layer can include a modified oxide layer that has low-reflectivity, thus preventing interference caused by light reflected from the set of heater-sensor dies. In some extreme variations, however, mitigation of interference due to reflected light from the set of heater-sensor dies can be produced by configuring the set of heater-sensor dies to be in misalignment with photodetectors of the optical subsystem, such that reflection does not interfere with light transmitted to the photodetectors of the optical subsystem, in modified versions of Block S270. For instance, the set of heater-sensor dies can be configured to heat a set of detection chambers from a first direction, and the optical subsystem can be configured to receive light from the set of detection chambers from a second direction (e.g., a direction non-parallel to the first direction), such that reflection from the set of heater-sensor dies 110 does not cause interference. In still other variations of Block S270, the set of heater-sensor dies can be processed with any other suitable elements (e.g., coatings, layers, etc.) and/or be configured in any other suitable manner that eliminates, prevents, or mitigates reflection from the set of heater-sensor dies from interfering with light transmitted to photodetectors of an optical subsystem in opposition to the set of heater-sensor dies 110.

The method 200 can additionally or alternatively include any other suitable blocks or steps configured to facilitate fabrication of a thermocycling element that can heat small volumes (e.g., microliter volumes, nanoliter volumes, picoliter volumes) of biological samples within containers in contact with the thermocycling element. For instance, the method 200 can include any one or more of: coupling the heating region to an electronics substrate S280; coupling the electronics substrate to an elastic element configured to bias the system against a detection chamber S290; and coupling at least one of the electronics substrate and the heating region to a heat sink-support S300 that facilitates heat dissipation within the system, while providing mechanical support for the heating region within the system. The method 200 can, however, include any other suitable blocks or steps.

The system 100 and/or method 200 of the preferred embodiment and variations thereof can be embodied and/or implemented at least in part as a machine configured to receive a computer-readable medium storing computer-readable instructions. The instructions are preferably executed by computer-executable components preferably integrated with the system 300 and one or more portions of the processor 350. The computer-readable medium can be stored on any suitable computer-readable media such as RAMs, ROMs, flash memory, EEPROMs, optical devices (CD or DVD), hard drives, floppy drives, or any suitable device. The computer-executable component is preferably a general or application specific processor, but any suitable dedicated hardware or hardware/firmware combination device can alternatively or additionally execute the instructions.

The FIGURES illustrate the architecture, functionality and operation of possible implementations of methods according to preferred embodiments, example configurations, and variations thereof. In this regard, each block in the flowchart or block diagrams may represent a module, segment, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A system for thermocycling biological samples within detection chambers comprising:
    a set of heater-sensor dies, each heater-sensor die in the set of heater-sensor dies comprising:
        an assembly including a first insulating layer;
        a heating region comprising a heating element, a sensing element, an adhesion material layer coupled to the first insulating layer, and a noble metal layer coupled to the adhesion material layer;
        a second insulating layer coupled to the first insulating layer through a pattern of voids in the heating region;
    an electronics substrate configured to couple the heating elements and the sensing elements of the set of heater-sensor dies to a controller; and
    a set of elastic elements configured to bias each of the set of heater-sensor dies against a set of detection chambers during operation;
    wherein the pattern of voids in the heating region defines:
        a first pattern comprising a global morphology at a first size scale the first pattern associated with the heating element of the heating region; and
        a second pattern comprising a local morphology at a second size scale smaller than the first size scale, the second pattern integrated into the first pattern and associated with the sensing element of the heating region.

2. The system of claim 1, wherein the set of elastic elements is coupled to a second substrate surface of the electronics substrate opposing a first substrate surface of the electronics substrate that interfaces with the assemblies of the set of heater-sensor dies.

3. The system of claim 2, wherein the electronics substrate is a flexible substrate and wherein the system further comprises a set of heat-sink supports coupled to at least one of the set of heater-sensor dies and the second substrate surface of the electronics substrate and configured to dissipate heat generated by the set of heater-sensor dies, wherein a base surface of each of the set of heat-sink supports is coupled to an elastic element configured to transmit a biasing force through the flexible substrate, thereby maintaining thermal communication between the set of heater-sensor dies and the set of detection chambers in the configuration wherein the set of heater-sensor dies is in thermal communication with the set of detection chambers.

4. The system of claim 1, wherein the adhesion material layer comprises at least one of chromium, titanium, niobium, and vanadium.

5. The system of claim 1, wherein the noble metal layer comprises at least one of gold, platinum, tungsten, and palladium.

6. The system of claim 1, wherein the adhesion material layer and the noble metal layer are annealed layers that provide stabilized resistance behavior and prevent drift in heating and sensing using the heating region.

7. The system of claim 1, wherein the pattern of voids defines a pattern of boustrophedonic segments, wherein the first pattern includes wide segments associated with the heating element, and wherein the second pattern includes segments, surrounded by and narrower than the wide segments, associated with the sensing element of the heating region.

8. The system of claim 1, wherein the assembly further comprises an intermediate buffer layer comprising at least one of platinum and titanium, situated between the adhesion material layer and the noble metal layer, and operable to provide a barrier against diffusion between the adhesion material layer and the noble metal layer.

9. The system of claim 8, wherein the pattern defined through the adhesion material layer and the noble metal layer is operable to provide a resistance change per temperature change greater than 0.1 ohms/° C.

10. The system of claim 1, wherein each of the set of heater-sensor dies includes a coating, proximal the heating surface, configured to mitigate reflection of light from the heating surface toward photodetectors of an optical subsystem during operation.

11. A system for thermocycling biological samples within detection chambers comprising:
    a set of heater-sensor dies, each heater-sensor die in the set of heater-sensor dies comprising:
        an assembly including a first insulating layer;
        a heating region comprising a heating element, a sensing element, an adhesion material layer coupled to the first insulating layer, and a noble metal layer coupled to the adhesion material layer; and
        a second insulating layer coupled to the first insulating layer through a pattern of voids in the heating region;
    wherein the pattern of voids in the heating region defines:
        a first pattern comprising a global morphology at a first size scale, the first pattern associated with the heating element of the heating region; and
        a second pattern comprising a local morphology at a second size scale smaller than the first size scale, the second pattern integrated into the first pattern and associated with the sensing element of the heating region;
    wherein the assembly further comprises an intermediate buffer layer comprising at least one of platinum and titanium, situated between the adhesion material layer and the noble metal layer, and operable to provide a barrier against diffusion between the adhesion material layer and the noble metal layer.

12. The system of claim 11, further including:
    an electronics substrate configured to couple the heating elements and the sensing elements of the set of heater-sensor dies to a controller; and
    a set of elastic elements configured to bias each of the set of heater-sensor dies against a set of detection chambers during operation.

13. The system of claim 12, wherein the set of elastic elements is coupled to a second substrate surface of the electronics substrate opposing a first substrate surface of the electronics substrate that interfaces with the assemblies of the set of heater-sensor dies.

14. The system of claim 13, wherein the electronics substrate is a flexible substrate and wherein the system further comprises a set of heat-sink supports coupled to at least one of the set of heater-sensor dies and the second substrate surface of the electronics substrate and configured to dissipate heat generated by the set of heater-sensor dies, wherein a base surface of each of the set of heat-sink supports is coupled to an elastic element configured to transmit a biasing force through the flexible substrate, thereby maintaining thermal communication between the set of heater-sensor dies and the set of detection chambers in the configuration wherein the set of heater-sensor dies is in thermal communication with the set of detection chambers.

15. The system of claim 11, wherein the adhesion material layer comprises at least one of chromium, titanium, niobium, and vanadium.

16. The system of claim 11, wherein the noble metal layer comprises at least one of gold, platinum, tungsten, and palladium.

17. The system of claim 11, wherein the adhesion material layer and the noble metal layer are annealed layers that provide stabilized resistance behavior and prevent drift in heating and sensing using the heating region.

18. The system of claim 11, wherein the pattern of voids defines a pattern of boustrophedonic segments, wherein the first pattern includes wide segments associated with the heating element, and wherein the second pattern includes segments, surrounded by and narrower than the wide segments, associated with the sensing element of the heating region.

19. The system of claim 11, wherein the pattern defined through the adhesion material layer and the noble metal layer is operable to provide a resistance change per temperature change greater than 0.1 ohms/° C.

20. The system of claim 11, wherein each of the set of heater-sensor dies includes a coating, proximal the heating surface, configured to mitigate reflection of light from the heating surface toward photodetectors of an optical subsystem during operation.

* * * * *

UNITED STATES PATENT AND TRADEMARK OFFICE
CERTIFICATE OF CORRECTION

PATENT NO. : 10,239,060 B2  
APPLICATION NO. : 15/297736  
DATED : March 26, 2019  
INVENTOR(S) : Sundaresh Brahmasandra et al.

Page 1 of 1

It is certified that error appears in the above-identified patent and that said Letters Patent is hereby corrected as shown below:

In the Claims

Column 22, Line 29:  
In Claim 9, delete "ohms/° C." and insert --ohms/°C.-- therefor Column 24, Line 16:  
In Claim 19, delete "ohms/° C." and insert --ohms/°C.-- therefor Signed and Sealed this  
Third Day of March, 2020

Andrei Iancu  
*Director of the United States Patent and Trademark Office*